United States Patent
Drenth et al.

(10) Patent No.: US 7,102,382 B2
(45) Date of Patent: Sep. 5, 2006

(54) DIGITAL ELECTRONIC CIRCUIT WITH LOW POWER CONSUMPTION

(75) Inventors: Joannes Christianus Drenth, Mettmenstetten (CH); Daniel Thommen, Zurich (CH); Zeljko Mrcarica, Zurich (CH); Kurt Henggeler, Winterthur (CH)

(73) Assignee: Koninklijke Philips Electronics N.V., Eindhoven (NL)

( * ) Notice: Subject to any disclaimer, the term of this patent is extended or adjusted under 35 U.S.C. 154(b) by 70 days.

(21) Appl. No.: 10/503,427

(22) PCT Filed: Jan. 29, 2003

(86) PCT No.: PCT/IB03/00306

§ 371 (c)(1),
(2), (4) Date: Aug. 3, 2004

(87) PCT Pub. No.: WO03/067759

PCT Pub. Date: Aug. 14, 2003

(65) Prior Publication Data

US 2005/0200382 A1   Sep. 15, 2005

(30) Foreign Application Priority Data

Feb. 6, 2002   (EP) .................. 02002682

(51) Int. Cl.
*G06F 7/38* (2006.01)
*H03K 19/173* (2006.01)
*H03K 19/096* (2006.01)

(52) U.S. Cl. .................... 326/38; 326/37; 326/46; 326/95; 326/98

(58) Field of Classification Search ............ 326/37–38, 326/46, 95, 98
See application file for complete search history.

(56) References Cited

U.S. PATENT DOCUMENTS

| | | | | |
|---|---|---|---|---|
| 6,141,761 A | * | 10/2000 | Chang et al. | 713/300 |
| 6,239,614 B1 | * | 5/2001 | Morikawa | 326/39 |
| 6,281,710 B1 | * | 8/2001 | Poirier et al. | 326/93 |
| 6,433,584 B1 | * | 8/2002 | Hatae | 326/80 |

FOREIGN PATENT DOCUMENTS

| | | |
|---|---|---|
| EP | 1 195 902 A2 | 4/2002 |
| JP | 8 142456 | 6/1996 |

* cited by examiner

*Primary Examiner*—Rexford Barnie
*Assistant Examiner*—Jason Crawford

(57) ABSTRACT

The digital electronic circuit (1) includes a logic cell (2) for processing data (82), a flip-flop (3) for storing data (83) processed in the logic cell (2), a power supply (4), and a clock (5) for triggering the flip-flop (3). The logic cell (2) is disconnected from the power supply (4) when the clock (5) is not active, as it is not needed for memorizing of the flip-flop states, and connected with the power supply (4) when the clock (5) is enabled. For switching the power supply, a switch (7) switched by the clock enable (6) is arranged between the logic cell (2) and the power supply (4). Such a simple additional switch (7) occupies only a relatively small area on the chip, but permits a drastic reduction by about 90% of the leakage currents. The circuit (1) is especially design and may be used for instance in mobile telecommunication devices.

11 Claims, 5 Drawing Sheets

DIGITAL ELECTRONIC CIRCUIT WITH LOW POWER CONSUMPTION

CONTINUATION DATA

This application is a 371 of PCT/IB03/00306 filed on Jan. 29, 2003.

The invention relates to digital electronic circuits and more particularly to a clocked digital electronic circuit with low power consumption and a method for reducing the power consumption in a digital electronic circuit. It is especially suitable for a decimation of leakage currents in sub-micron process design and may advantageously be used for instance in mobile telecommunication devices.

In today's mobile telecom integrated systems on a chip (SoCs) many different clocks are used. The reason for this is power saving. The lower the clock frequency, the less power is consumed. To decrease the power consumption of the circuit even more, the clocks are stopped if no activity is needed.

An image-forming device with a power-saving function is disclosed, e.g., in the publication JP-A-08-142456. The device comprises an image-forming part, a central processing unit (CPU), an interface for connecting with an external host device and a panel part. After the elapse of a predetermined time period since the last printing operation, the CPU switches the device to a power-saving mode by sending a halt instruction. Consequently, an oscillating circuit is stopped and a logic power source is cut off. When the interface receives data from the external host device or an operating switch in the panel part is actuated, an interruption signal goes into the CPU so as to re-start the printing operation.

The feature size on the integrated circuits (ICs) is getting smaller. This enables the system designers of SoCs to decrease the cell size more and more and therefore the number of transistors in ICs is getting larger. The disadvantage of the smaller feature size is that the leakage current is increasing and is nearing the operational current. That means that even if the circuit is not in the active mode (i.e., the clock disabled), a significant current is flowing and power is consumed.

The main source of the leakage current are subthreshold currents in transistors, appearing when $|V_{GS}-V_{TH}|<0$ V, but $|V_{DS}|>0$ V (where $V_{GS}$ denotes the gate-source voltage, $V_{DS}$ denotes the drain-source voltage and $V_{TH}$ denotes the threshold voltage of a transistor). The dependence of the leakage current on $V_{GS}$ is exponential. For long-channel transistors, the dependence of the subthreshold current on $V_{DS}$ is linear. However, for short-channel transistors, an increase of $|V_{DS}|$ leads to a decrease of the effective transistor threshold voltage $|V_{TH}|$. This makes the difference $|V_{GS}-V_{TH}|$ bigger, and therefore the leakage current depends exponentially on $|V_{DS}|$. In complementary metal oxide semiconductor (CMOS) logic cells it appears often that the transistor that is turned off has a $|V_{DS}|$ nearly equal to $V_{DD}-V_{SS}$ (where $V_{DD}$ denotes a supply voltage and $V_{SS}$ a ground voltage, GND), thus having considerable leakage current.

It is an object of the invention to provide a clocked digital electronic circuit with low power consumption which overcomes the above-mentioned deficiencies. It is a further object of the invention to provide a method for reducing the power consumption of a clocked digital electronic circuit. These and other problems are solved by the digital electronic circuit and the method according to the invention, as defined in the independent claims.

The information (data) in a digital circuit is stored in memory elements (flip-flops). The input data is calculated in a logic cell in front of the flip-flop. The content of a flip-flop is updated when the flip-flop it is triggered by a clock. As long as the power supply is switched on and there is no trigger on the clock signal, the data stored in the flip-flop remains the same. The invention makes use of the recognition that the logic cells can be turned off when the clock is not active, as they are not needed for memorizing of the flip-flop states. The logic cells only need the power supply when the clock is active. The signal that switches the power supply is the clock enable. When the power is again switched on, less than one clock cycle is necessary to recover the data that are input to the flip-flops. For switching the power supply off and on, a switch switched by the clock enable is arranged between the logic cell and the power-supply. Such a simple additional switch occupies only a relatively small area on the chip, but permits a drastic reduction of about 90% of the leakage currents by making use of their exponential dependence on $|V_{DS}|$.

Thus, the digital electronic circuit according to the invention comprises a logic element for processing data, a memory element for storing data processed in said logic element, power-supply means for supplying said logic element and said memory element with electric power, clocking means for generating a clock signal by which said memory element is triggered, enabling means for enabling and disabling the triggering of said memory element by said clocking means, and switching means for clearing and completing the connection between said logic element and said power-supply means, said switching means being switched by said enabling means.

The invention also relates to a method for reducing the power consumption of a digital electronic circuit, the circuit comprising a logic element for processing data, a memory element for storing data processed in said logic element, power-supply means for supplying said logic element and said memory element with electric power, and clocking means for generating a clock signal by which said memory element is triggered; the method comprises the steps of clearing the connection between said logic element and said power-supply means when the triggering of said memory element is disabled, and completing the connection between said logic element and said power-supply means when the triggering of said memory element is enabled.

Advantageous embodiments of the invention are defined in the dependent claims.

The invention and, for comparison, the prior art are described in greater detail hereinafter relative to the attached schematic drawings.

FIG. 7 shows schematic diagram of simulation results for the digital circuit of FIG. 5, wherein

Figure 1:
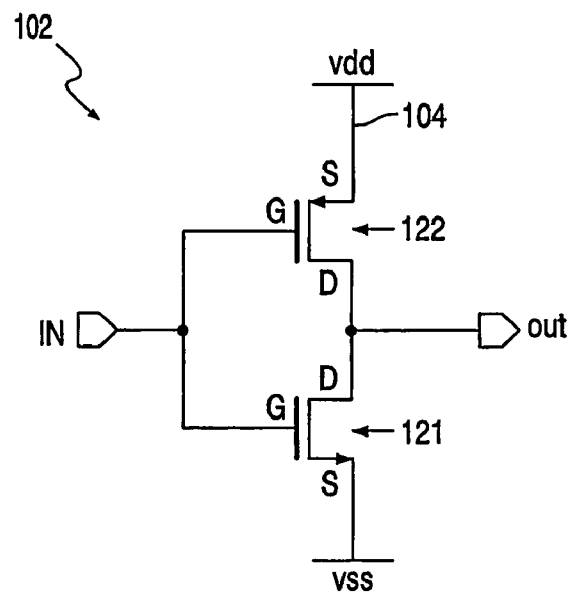
FIG. 1 shows a circuit diagram of a simple CMOS circuit according to the prior art.

In FIG. 1, a very simple CMOS circuit 102 according to the prior art, an inverter, is shown as an illustration of the problem solved by the invention. The circuit 102 comprises two transistors 121, 122, an input pin IN and an output pin out. A supply voltage $V_{DD}$ and a ground voltage $V_{SS}$ are applied to the circuit 102. If the input pin IN is low, the first transistor 121 is off, and the second transistor 122 is on. The voltage on the output pin out and therefore on the drain D of the first transistor 121 is high ($V_{DD}$). Thus, the first transistor 121 has a drain-source voltage $V_{DS}$ that equals $V_{DD}$–$V_{SS}$, and therefore it has a considerable leakage current, even if there are no transitions in the circuit 102. This happens with every logic gate in a CMOS circuit.

Figure 2:
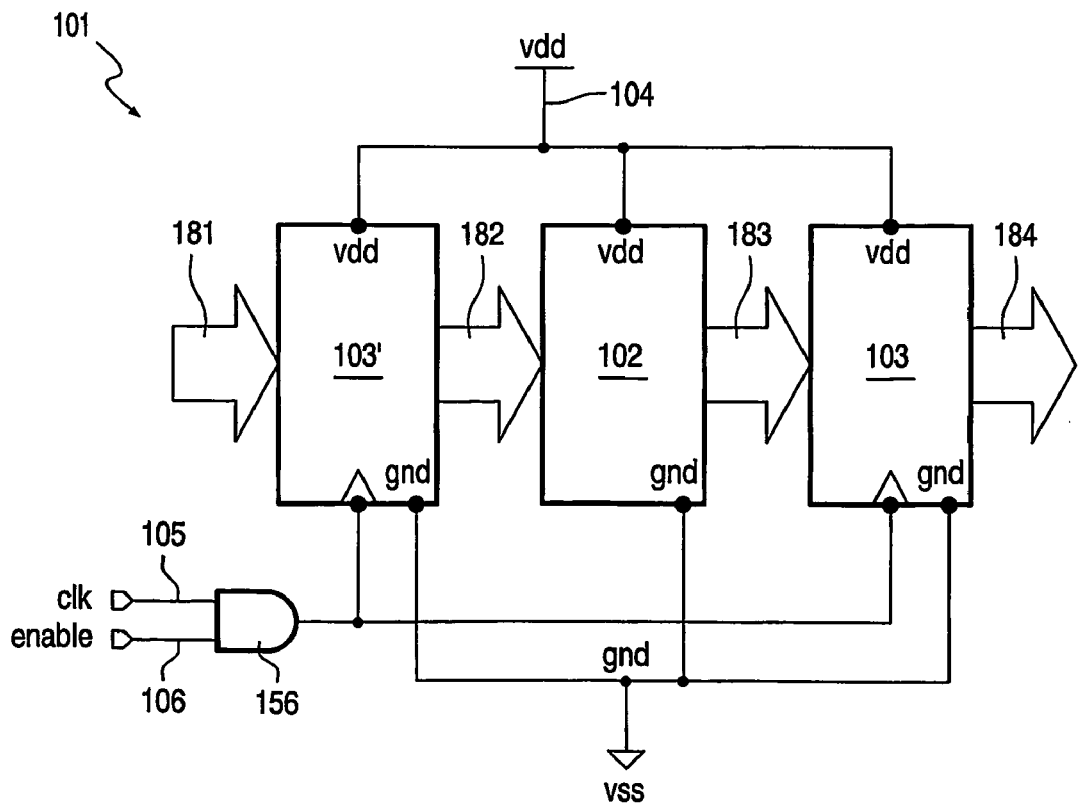
FIG. 2 shows a block diagram of a digital circuit with clock gating according to the prior art.

FIG. 2 shows a block diagram of a digital circuit 101 with clock gating according to the prior art. The data flow through the circuit 101 is indicated by arrows 181–184. The information (data) in the circuit 101 is stored in memory elements (flip-flops) 103, 103'. Input data 183 for a flip-flop 103 is calculated in a logic element 102, comprising logic cells, in front of the flip-flop 103. The content of a flip-flop 103 is updated when the flip-flop 103 it is triggered by a clock 105. The clock 105 is enabled and disabled by an enabling line 106 by combining the clock line 105 and the enabling line 106 in an AND gate 156. A power-supply line 104 supplies the logic element 102 and the flip-flops 103, 103' with electric power. As long as the power supply 104 is switched on and there is no trigger on the clock signal, the data stored in the flip-flop 103 remains unchanged.

Figure 4:
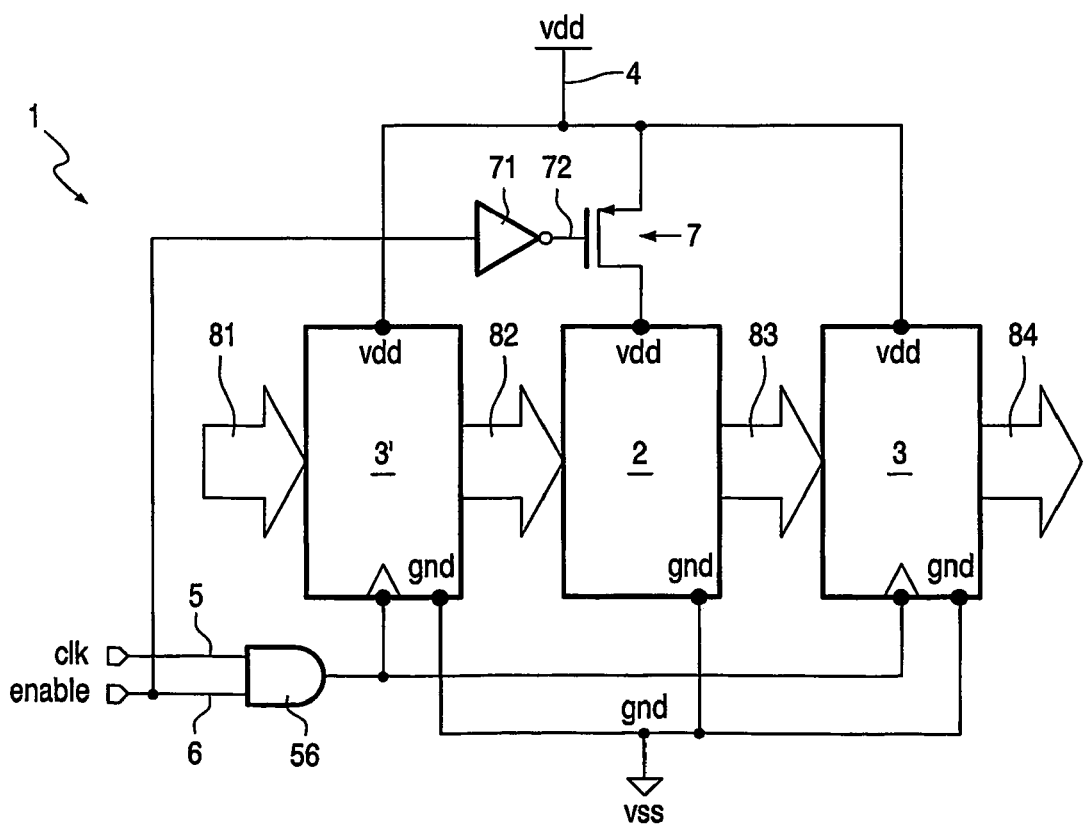
FIG. 4 shows a block diagram of a digital circuit with clock gating and power enable according to the invention.

The invention is explained with the help of FIG. 4, which shows a block diagram of a digital circuit 1 with clock gating according to the invention. The block diagram of FIG. 4 is analogous to that of FIG. 2, and also analogous reference numbers are used. The logic element 2 is turned off when the clock 5 is not active, as it is not needed for memorizing of the flip-flop states. The logic element 2 only needs the power supply 4 when the clock 5 is active. The signal that switches the power supply 4 is the clock enable 6. When the power is again switched on, less than one clock cycle is necessary to recover the data that are input to the flip-flop 3.

Compared to the circuit of FIG. 2, the digital circuit 1 according to the invention comprises an additional switch 7, e.g., a switching transistor, for connecting and disconnecting the logic element 2 to and from the power supply 4. The switch 7 is actuated by the clock enable 6; for obtaining the correct signal on the switch input line 72, the clock enable signal 6 is inverted by a logic inverter 71 into an "ENABLE NOT" signal. In the following, the effect of the switch 7 on the leakage currents is discussed. When the clock 5 is active, the switch 7 is turned on, thus having no effect on the circuit functionality, provided that the voltage drop on the switch transistor 7 is small enough, i.e., that its width-to-length (W/L) ratio is big enough. When the clock 5 is not active, the switch 7 is turned off. If the switch transistor 7 is long enough, its leakage current is small, thus minimizing the overall leakage current through the logic element 2. However, even if the switch transistor 7 has the same length as the transistors used in the logic element 2, leakage current is considerably reduced. The reason is the following: in all paths from $V_{DD}$ to $V_{SS}$ (GND), there are at least two transistors that are turned off, viz. the switch transistor 7 and at least one transistor 21 of the CMOS logic element 2 (cf. FIG. 3). In this way, there is a voltage divider formed by the transistors 7, 21 that are turned off, and the $V_{DS}$ voltage of such transistors 7, 21 is approximately halved. Halving of $V_{DS}$ significantly decreases the leakage current, due to the exponential dependence described above.

Figure 3:
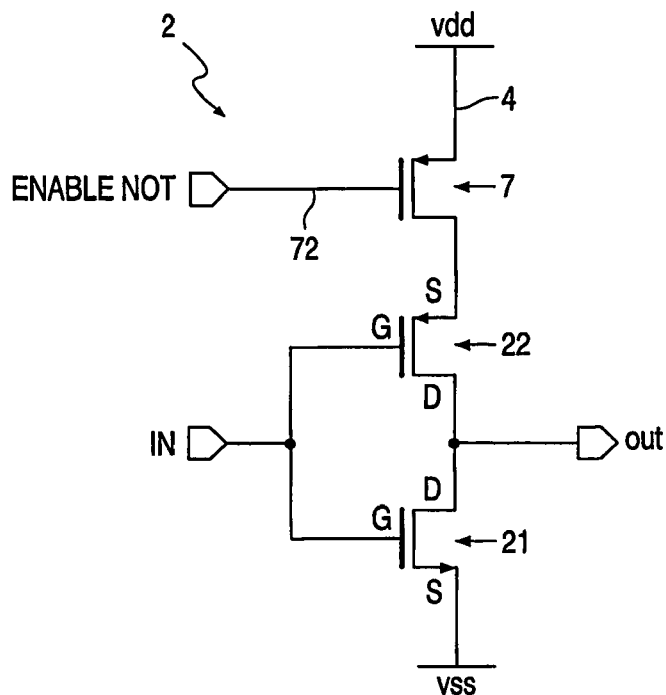
FIG. 3 shows a circuit diagram of a CMOS circuit according to the invention.

In the following, the inverter example (cf. FIG. 1) is discussed again, however, in an embodiment 1 according to the invention. An inverter 1 according to the invention is illustrated in FIG. 3. It comprises a p-channel MOS transistor 7 for switching off the power supply 4 when the logic circuit 2 is not active. If we again assume that input IN is low, the first transistor 21 is off, and the second transistor 22 is on. However, if the input ENABLE NOT is high, the switching transistor 7 is also off. The voltage divider is formed by the two transistors 21, 7 that are switched off, which halves the drain-source voltage $V_{DS}$. A two times smaller $V_{DS}$ voltage decimates the leakage current due to the exponential voltage-current dependence described above.

An analogue simulation of the circuit 1 that corresponds to the embodiment resulting from the combination of FIGS. 4 and 3 has been performed, using C050 technology models, and a p-channel MOS switch 7 that has minimal transistor length L and a width 10 times bigger than the minimal width of the logic transistors 21, 22. The simulation results have shown a 10 times smaller current consumption of the logic part 2 when the power supply 4 was turned off. This proves the analysis given above. The overall leakage current is decreased, although the switching transistor 7 is wider than transistors 21, 22 in the logic 2, and has minimal length. The same simulation has been repeated in CMOS18 technology, showing again a 10 times lower current consumption. It should be noted that the currents monitored in these simulations are total leakage currents, including those that are result of inversely polarized parasitic diodes, i.e., not only subthreshold transistor currents. It should further be noted that these simulation results are obtained without optimization of the switching-transistor size.

Figure 5:
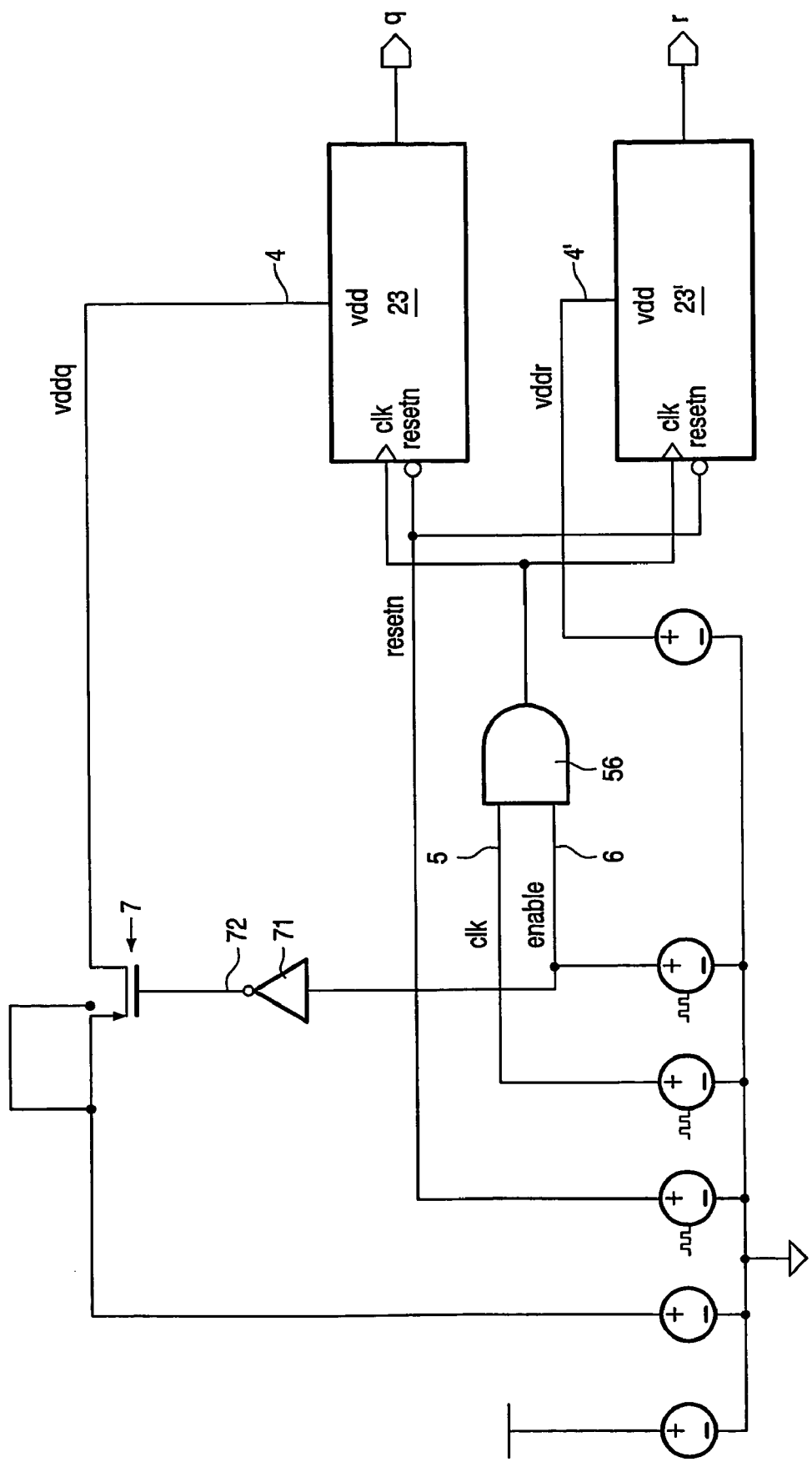
FIG. 5 shows a block diagram of a further embodiment of a digital circuit according to the invention.

FIG. 5 shows the circuit simulated as an example. It has two instances of a logic subcircuit 23, 23'. In a first instance 23 located in the upper part of the figure, the power supply 4 is switched off when the enable signal 6 is low, using a p-channel transistor switch 7. In a second instance 23' located in the lower part of the figure, the power supply 4' is always on.

Figure 6:
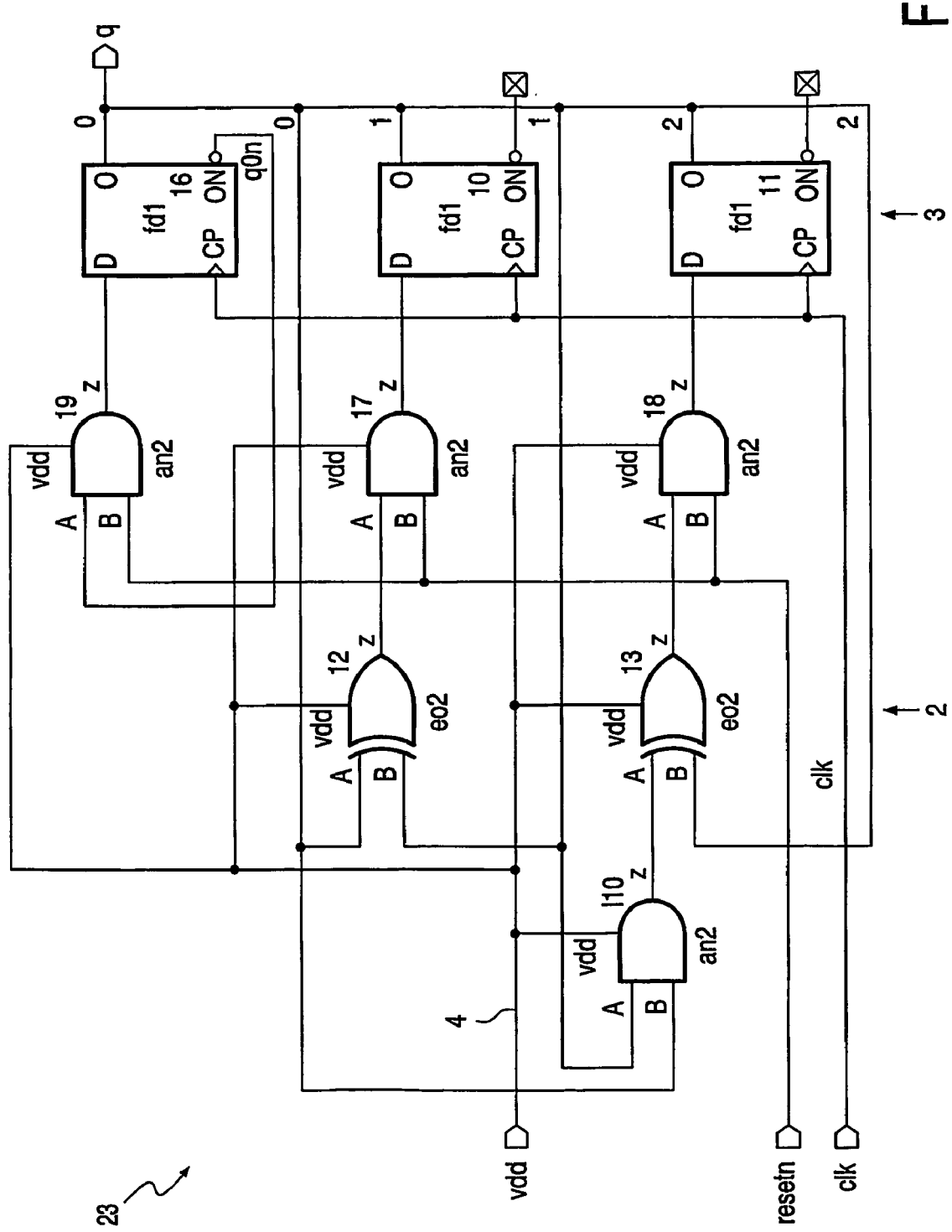
FIG. 6 shows a block diagram of a subcircuit of the digital circuit shown in FIG. 5.

In FIG. 6 the logic subcircuit 23 used in the simulation example of FIG. 5 is shown in detail. It consists of logic gates 2 and flip-flops 3. The power supply 4 of the logic gates 2 can be switched off, whereas the power supply of the flip-flops is always on (not shown in the figure, being a global signal).

Figure 7A:
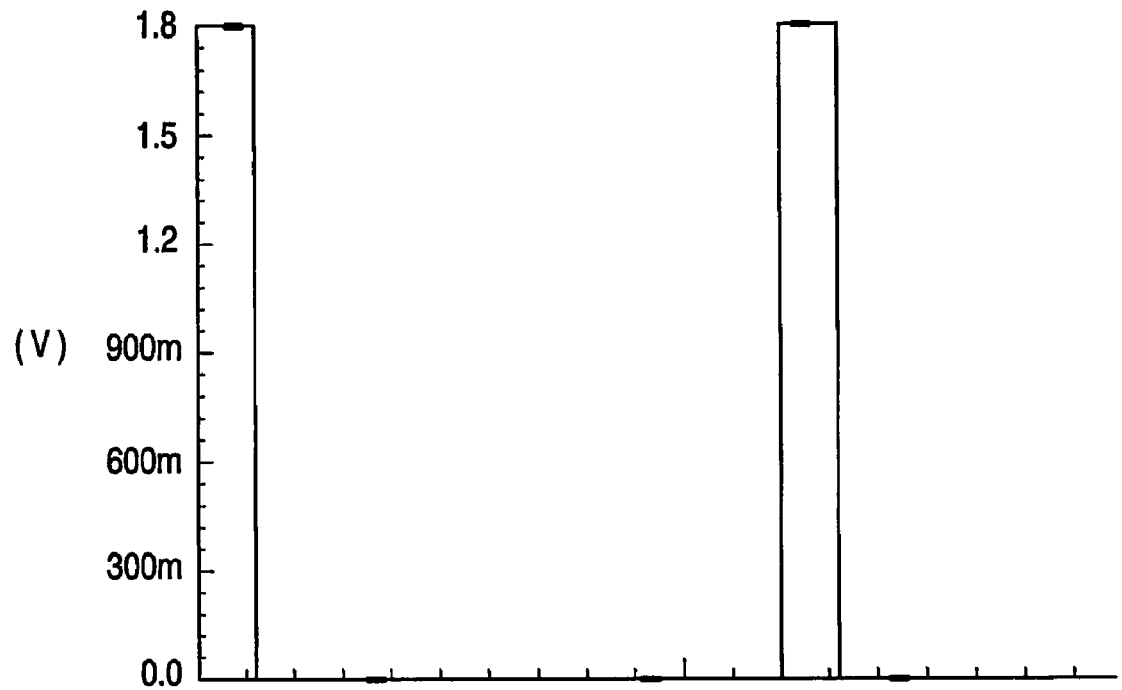
FIG. 7(a) shows an enable signal in a voltage-vs-time diagram, and (b) shows power-supply currents in a current-vs-time diagram.
Figure 7B:
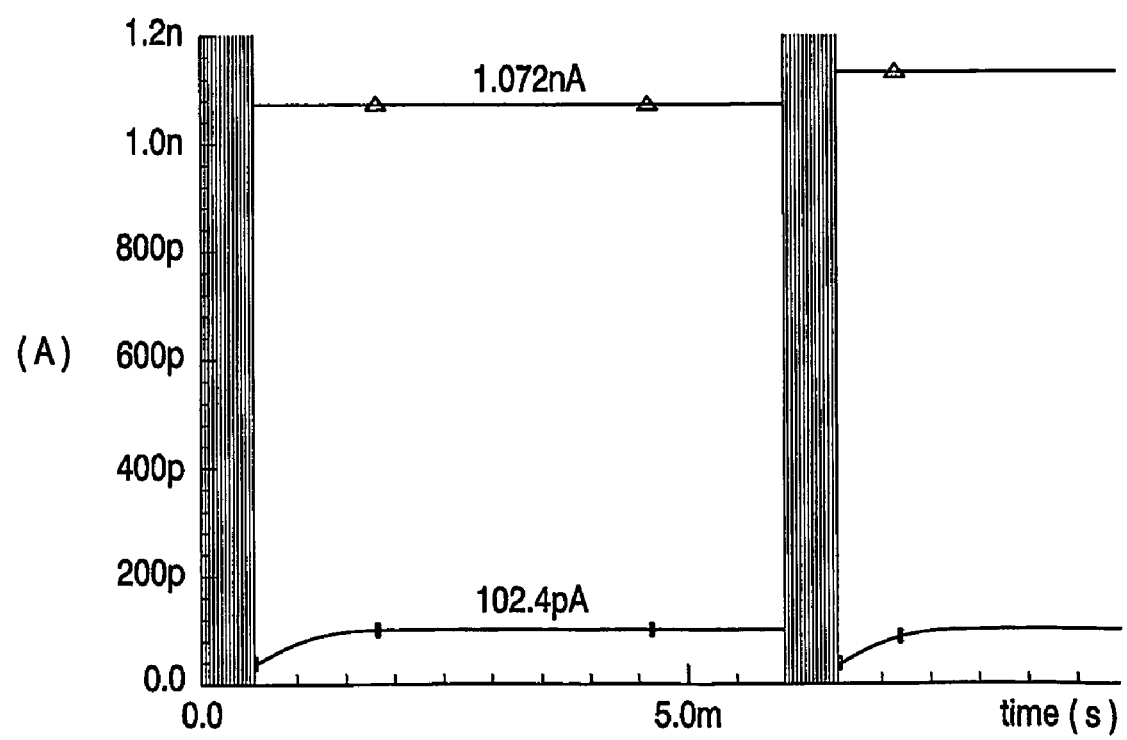

The results of the simulation of the circuit of FIG. 5 are shown in FIGS. 7(a) and 7(b). The signal shown in FIG. 7(a) is the enable signal on enable line 6. The two signals shown in FIG. 7(b) are the power-supply current vddr when the combinational logic 2 is switched on, i.e., connected to the second subcircuit 23', and the power-supply current vddq when the combinational logic 2 is switched off, i.e., disconnected from the first subcircuit 23 using a p-channel MOS switch 7. When the enable signal is low, vddr has value of 1.072 nA, which is the total leakage current of all combinational logic gates 2 in the second instance of subcircuit 23'. The value of vddq is 102.4 pA, which is the total leakage current of all combinational gates in the first instance of subcircuit 23. Therefore, by the use of one switching transistor 7, the leakage current is decreased by a factor of 10. The simulations also prove that the functional behavior of the circuit 1 when the clock 5 is active is not influenced by the introduction of the switching transistor 7.

In the embodiments and the simulation described above, p-channel MOS transistors, preferably p-channel MOSFET transistors, are used as a switch 7. n-channel MOS transistors can be also used, i.e., $V_{SS}$ (GND) can be disconnected as an alternative, and also two transistor types (p-channel MOS and n-channel MOS) can be used. One switch transistor 7 per logic element 2 can be used (as in FIGS. 3 and 4), or one for a logic element 2 comprising more cells (as in FIGS. 5 and 6).

In any case, the invention yields a significant power-consumption reduction by introducing a simple additional measure. It may advantageously be used for instance in mobile telecommunication devices for reducing their power consumption in the stand-by mode.

The invention claimed is:

1. A digital electronic circuit comprising:
    a logic element for processing data,
    a memory element for storing data processed in said logic element,
    power-supply means for supplying said logic element and said memory element with electric power,
    clocking means for generating a clock signal by which said memory element is triggered,
    enabling means for enabling and disabling the triggering of said memory element, and
    a single switching means for clearing and completing the connection between said logic element and said power-supply means, said switching means being switched by said enabling means.

2. The digital electronic circuit according to claim 1, wherein said switching means comprise a transistor.

3. The digital electronic circuit according to claim 2, wherein said transistor is a p-channel MOS transistor and/or an n-channel MOS transistor.

4. The digital electronic circuit according to any of the preceding claims, wherein said memory element comprises a flip-flop.

5. The digital electronic circuit according to claim 1, 2 or 3, wherein the circuit is manufactured in CMOS technology.

6. The digital electronic circuit according to claim 1, 2 or 3, wherein the circuit comprises a plurality of logic elements and a switching means is allocated to each logic element.

7. The digital electronic circuit according to claim 1, 2 or 3, wherein the circuit comprises a plurality of logic elements and a switching means is allocated to two or more logic elements.

8. A mobile telecommunication device comprising the digital electronic circuit according to claim 1, 2 or 3.

9. A method for reducing the power consumption of a digital electronic circuit, the circuit comprising:
    a logic element for processing data,
    a memory element for storing data processed in said logic element,
    power-supply means for supplying said logic element and said memory element with electric power, and
    clocking means for generating a clock signal by which said memory element is triggered,
comprising the steps of:
    clearing the connection between said logic element and said power-supply means by a single switching means when the triggering of said memory element is disabled, and
    completing the connection between said logic element and said power-supply means by a single switching means when the triggering of said memory element is enabled.

10. The method according to claim 9, wherein the connection is cleared shortly after the triggering of said memory element is disabled and the connection is completed shortly before the triggering of said memory element is enabled.

11. Use of the method according to claim 9 or 10 in a mobile telecommunication device.

* * * * *